United States Patent
Haung et al.

(10) Patent No.: US 9,710,937 B2
(45) Date of Patent: Jul. 18, 2017

(54) LOCAL ARTIFACT REDUCTION WITH INSIGNIFICANT SIDE EFFECTS

(71) Applicant: KONINKLIJKE PHILIPS N.V., Eindhoven (NL)

(72) Inventors: Feng Haung, Gainesville, FL (US); Arne Reykowski, Newberry, FL (US)

(73) Assignee: KONINKLIJKE PHILIPS N.V., Eindhoven (NL)

(*) Notice: Subject to any disclaimer, the term of this patent is extended or adjusted under 35 U.S.C. 154(b) by 58 days.

(21) Appl. No.: 14/648,271

(22) PCT Filed: Oct. 21, 2013

(86) PCT No.: PCT/IB2013/059489
§ 371 (c)(1),
(2) Date: May 29, 2015

(87) PCT Pub. No.: WO2014/087270
PCT Pub. Date: Jun. 12, 2014

(65) Prior Publication Data
US 2015/0302616 A1    Oct. 22, 2015

Related U.S. Application Data

(60) Provisional application No. 61/733,945, filed on Dec. 6, 2012.

(51) Int. Cl.
*G06K 9/00* (2006.01)
*G06T 11/00* (2006.01)
(Continued)

(52) U.S. Cl.
CPC ...... *G06T 11/008* (2013.01); *G01R 33/56509* (2013.01); *G01R 33/5611* (2013.01);
(Continued)

(58) Field of Classification Search
CPC .................. G06T 11/008; G01R 33/56509
See application file for complete search history.

(56) References Cited

U.S. PATENT DOCUMENTS 7,418,287 B2    8/2008    Tsao
7,903,858 B2    3/2011    Chang
(Continued)

FOREIGN PATENT DOCUMENTS

WO    2012123921 A1    9/2012

OTHER PUBLICATIONS

Martin, Blaimer et al "Smash, Sense, Pils, Grappa: How to Choose the Optimal Method", Topics in Magnetics Resonance Imaging, vol. 15, N. 4, Aug. 2004.
(Continued)

*Primary Examiner* — Oneal R Mistry

(57) ABSTRACT

A medical imaging system (34) includes a memory (45) and one or more processors (60). The memory (45) stores magnetic resonance k-space data (4) and the magnetic resonance data includes non-rigid motion defects. The one or more processors (60) are configured to reconstruct (6) a first image (8) from the magnetic resonance data (4) which includes a high signal to noise ratio and motion artifacts. The one or more processors are further configured to detect and reject (10) portions of k-space (4) which include non-rigid motion defects, and reconstruct (4) a second image (16) from non-rejected portions of k-space (12) and the first image (8).

15 Claims, 5 Drawing Sheets

(51) Int. Cl.
    G01R 33/565    (2006.01)
    G01R 33/561    (2006.01)
(52) U.S. Cl.
    CPC ............... G06T 2207/10004 (2013.01); G06T 2207/10088 (2013.01)

(56) References Cited

U.S. PATENT DOCUMENTS

| | | | | |
|---|---|---|---|---|
| 2002/0156364 | A1* | 10/2002 | Madore | G01R 33/5611 600/410 |
| 2008/0071167 | A1* | 3/2008 | Ikedo | G01R 33/56545 600/419 |
| 2009/0161932 | A1 | 6/2009 | Chen | |
| 2011/0293158 | A1 | 12/2011 | Popescu | |
| 2012/0002858 | A1 | 1/2012 | Huang | |
| 2012/0082355 | A1 | 4/2012 | Mendes | |
| 2012/0269414 | A1* | 10/2012 | Zha | G06T 5/002 382/131 |
| 2013/0251225 | A1* | 9/2013 | Liu | G01R 33/5673 382/131 |
| 2013/0251227 | A1* | 9/2013 | Wang | G01R 35/00 382/131 |
| 2014/0002078 | A1* | 1/2014 | Chen | G01R 33/543 324/309 |
| 2014/0079305 | A1* | 3/2014 | Akcakaya | G06T 7/0012 382/131 |
| 2014/0376794 | A1* | 12/2014 | Dumoulin | G01R 33/5611 382/131 |

OTHER PUBLICATIONS

Feng, Huang et al "Data Convolution and Combination Operation (COCOA) for Motion Ghost Artifacts Reduction", Magnetic Resonance in Medicine, vol. 64, No. 1, Jul. 2010, pp. 157-166.

Cheng, Joseph Y. et al "Nonrigid Motion Correction in 3D using AUtofocusing with Localized Linear Translations", Magnetic Resonance IM Medicine, vol. 68, No. 6, Feb. 2012, pp. 1785-1797.

Samsonov, Alexey A. et al "POCS-enhanced Correction of Motion Artifacts in Parallel MRI", Magnetic in Resonance in Medicine, vol. 63, No. 4, Apr. 2010.

Kadah, Yasser M. "Motion Artifact Suppression in MRI using k-Space Overlap Processing", National Radio Science Conference, 2008, pp. 1-9.

Bydder, M. et al "Detection and Elimination of Motion Artifacts by Regeneration of K-Space", Magnetic Resonance in Medicine, vol. 47, No. 4, Apr. 2000, pp. 677-686.

Sachs, T.S. et al "Real-Time Motion Detection in Spiral MRI using Navigators", Magnetic Resonance in Medicine, vol. 33, Jan. 1994, pp. 639-645.

Nielsen, Tim et al "Iterative Motion Compensated Reconstruction for Parallel Imaging using an Orbital Navigator", Magnetic Resonance in Medicine, 2011.

Huang, Feng et al "A Reconstruction Method for Non-Rigid Motion Compensation in Brain MRI", 2011.

Lin, Fa-Hsuan et al "Parallel Imaging Reconstruction using Automatic Regularization", Magnetic Resonance in Medicine, vol. 51, pp. 559-567, 2004.

Bydder, M. et al SMASH Navigators, Magnetic Resonance in Medicine, vol. 49, 2003, pp. 493-500.

* cited by examiner

LOCAL ARTIFACT REDUCTION WITH INSIGNIFICANT SIDE EFFECTS

CROSS-REFERENCE TO PRIOR APPLICATIONS

This application is the U.S. National Phase application under 35 U.S.C. §371 of International Application No., filed on PCT/IB2013/059489, which claims the benefit of U.S. Provisional Patent Application No. 61/733,945, filed on Dec. 6, 2012. These applications are hereby incorporated by reference herein.

BACKGROUND

The following relates generally to medical imaging. It finds particular application in conjunction with magnetic resonance imaging, image reconstruction, and non-rigid motion artifact reduction, and will be described with particular reference thereto. However, it will be understood that it also finds application in other usage scenarios and is not necessarily limited to the aforementioned application.

Magnetic resonance (MR) imaging provides detailed anatomical and metabolic information of a subject. MR imaging involves no ionizing radiation and works by exciting magnetic resonance in tissue of the subject. Magnetic resonance occurs within a static main field $B_0$ which is typically oriented horizontally or vertically. Radio frequency (RF) pulses are applied to excite resonance. Gradient fields are applied across the static field to focus and manipulate resonance in the subject. The local coils receive the weak magnetic resonance decay RF signals close to the body and retransmit the received signals to a receiver. The magnetic field direction of the received RF field is orthogonal to the magnetic field direction of the main field ($B_0$). The received RF or magnetic resonance (MR) data is received into k-space or a memory of the spatial frequencies. The MR data in k-space is reconstructed into one or more images.

During the imaging process, the received MR data is susceptible to motion artifacts. Motion is classified as rigid motion such as nodding the head and non-rigid motion such as eye movement. Rigid motion can be compensated for by techniques which use the rigid parts of the body such as bone to properly reorient the MR data. For example, rotation angles and translation distances can be used to compensate for nodding. However, non-rigid motion remains such as eye movement which includes eye ball rolling, skin movement which includes frowning, jaw movement which includes swallowing and/or yawning, and the like. Non-rigid motion can cause spatially localized artifacts. With non-rigid motion, most of the image has good image quality with a high signal to noise ratio (SNR), but some portions of the image include motion artifacts.

One approach is to simply re-run the imaging sequence, which uses valuable clinical time. Another approach is to reject the portions of k-space data which include motion defects, and then reconstruct an image using motion free k-space. Algorithms such as data convolution and combination operation (COCOA) are used to detect motion in k-space and reject the portions of k-space which include motion. Algorithms such as SENSE can be used to perform a partial k-space reconstruction into an image. However, reconstructions of partial k-space typically yield low image quality due to a high reduction factor and data missing in the center of k-space. The result includes a low SNR, but a motion free image.

One consequence of partial k-space reconstructions is image aliasing. Image aliasing occurs as a result of removing the portions of k-space which analogously result in a negative of the motion artifact due to the loss of the portions of k-space and the reduced SNR.

SUMMARY

The following discloses a new and improved method of local artifact reduction with insignificant side effects which addresses the above referenced issues, and others.

In accordance with one aspect, a medical imaging system includes a memory and one or more processors. The memory stores magnetic resonance k-space data and the magnetic resonance data includes non-rigid motion defects. The one or more processors are configured to reconstruct a first image from the magnetic resonance data which includes a high signal to noise ratio and motion artifacts. The one or more processors are further configured to detect and reject portions of k-space which include non-rigid motion defects, and reconstruct a second image from non-rejected portions of k-space and the first image.

In accordance with another aspect, a method of medical imaging includes receiving magnetic resonance k-space data which includes non-rigid motion defects. A first image is reconstructed from the magnetic resonance data which includes non-rigid motion defects. Portions of k-space which include non-rigid motion defects are detected and rejected. A second image is reconstructed from non-rejected portions of k-space and the first image.

In accordance with another aspect, a medical imaging system includes a memory, one or more processors, and a display. The memory stores received magnetic resonance k-space data and the magnetic resonance data includes non-rigid motion artifacts. The one or more processors are configured to reconstruct a first image which includes motion artifacts. The one or more processors are further configured to reconstruct a second image from the portions of k-space without the motion artifacts, the first image, and a regularization estimate, the reconstruction using regularized sensitivity encoding (SENSE). The display displays the second image.

One advantage is the reconstruction of images with high signal to noise ratio and reduction of non-rigid motion artifacts.

Another advantage is the reconstruction of images without image aliasing.

Another advantage resides in artifact reduction without additional data acquisition.

Another advantage resides in using prior information explicitly or implicitly in reconstructing images.

Another advantage resides in the reuse of existing hardware and software in acquisition and reconstruction.

Still further advantages will be appreciated to those of ordinary skill in the art upon reading and understanding the following detailed description.

BRIEF DESCRIPTION OF THE DRAWINGS

The invention may take form in various components and arrangements of components, and in various steps and arrangement of steps. The drawings are only for purposes of illustrating the preferred embodiments and are not to be construed as limiting the invention.

DETAILED DESCRIPTION

Figure 1:
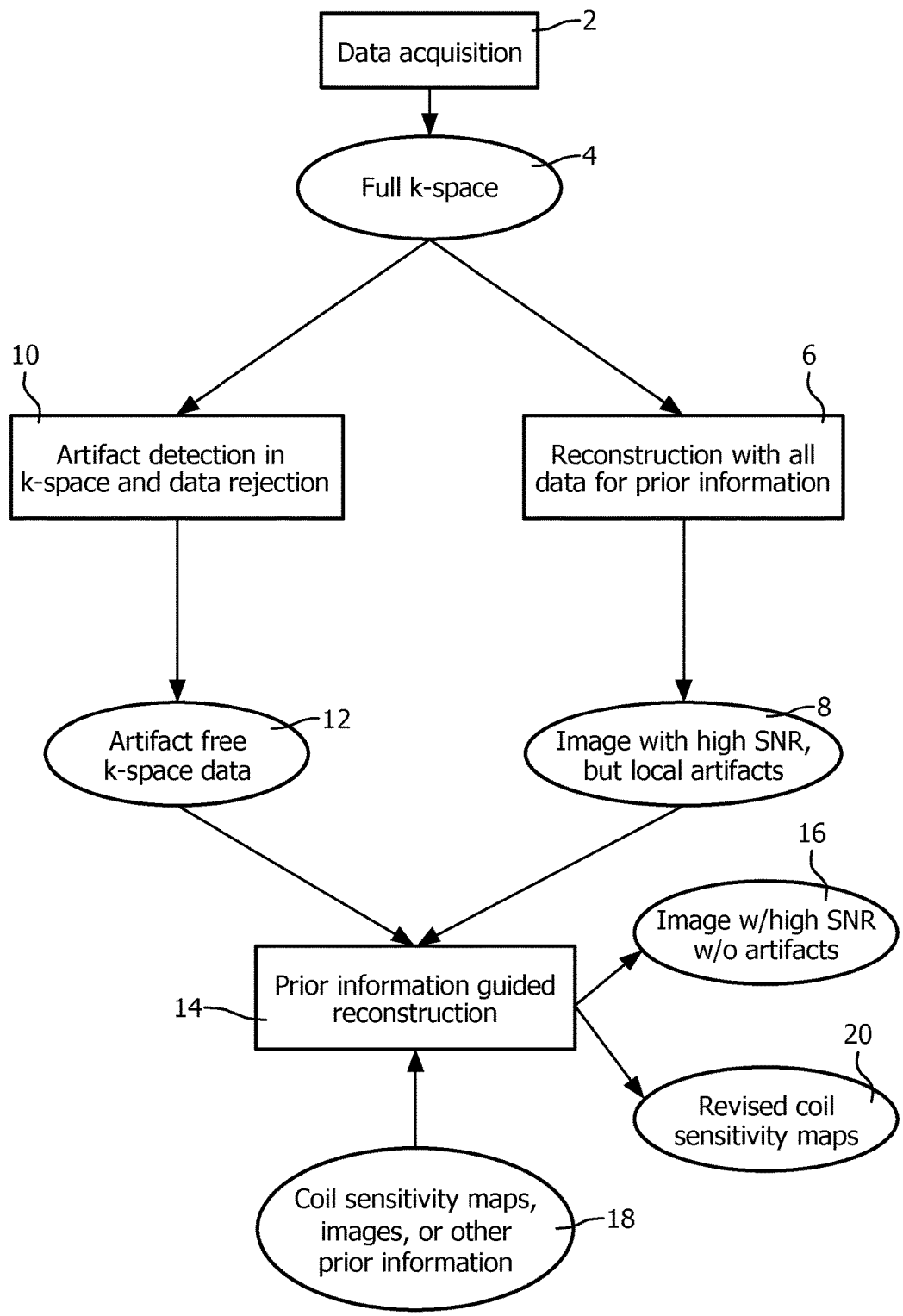
FIG. 1 flowcharts an embodiment of local artifact reduction with insignificant side effects.

With reference to FIG. 1, an embodiment of local artifact reduction with insignificant side effects is flowcharted. In a step 2, magnetic resonance (MR) or k-space data is acquired and stored. The MR data includes a full k-space 4 sample and includes non-rigid motion. From the full k-space sample in a step 6, an image 8 is reconstructed. The reconstructed image 8 from the fully sampled k-space yields an image with high signal to noise ratio (SNR), but with one or more local motion artifacts.

In a step 10, also from the full k-space 4 sample, motion is detected in portions of the k-space and the portions with motion are rejected. The non-rejected portions of k-space form artifact free partial k-space 12. Motion can be detected in k-space using techniques such as a data convolution and combination operation algorithm (COCOA), a generalized auto-calibrating partially parallel algorithm (GRAPPA), and the like. The portions of the k-space data which include motion are rejected.

Prior information guided reconstruction reconstructs, in a step 14, a high SNR, motion free image 16 from the motion artifact free partial k-space 12 and the initial motion artifacted reconstructed image 8 from the full k-space sample. In one embodiment, reconstruction 14 is performed using a technique such as prior information regularized sensitivity encoding (SENSE). A regularization estimate is estimated using the initial reconstructed image 8. The regularization estimate can be revised using coil sensitivity maps 18 generated from a pre-scan and/or other prior information. The reconstruction can also generate revised coil sensitivity maps 20. The prior information provides constraints in the reconstruction. For example, with motion artifact free k-space data 12 and the high SNR image 16 with portions which are artifact free, a system of linear equations is created as part of the SENSE with regularization. A set of k-space lines generates a voxel in image space with a function $f(x_1, x_2, x_3, \ldots x_n) = v_i$ where $x_j$ is a line of the k-space, and $v_i$ is the reconstructed voxel of the initial high SNR image 8 based on the function. With a plurality of motion artifact free k-space lines x known and some number of voxels v known from the initial reconstructed image, a series of linear equations are constructed which provide the regularization estimate or a constraint on the function $f$. The reconstructed image 16 includes a high SNR based on the initial high SNR image 8, but without local artifacts based on the artifact free k-space data 12.

Figure 2:
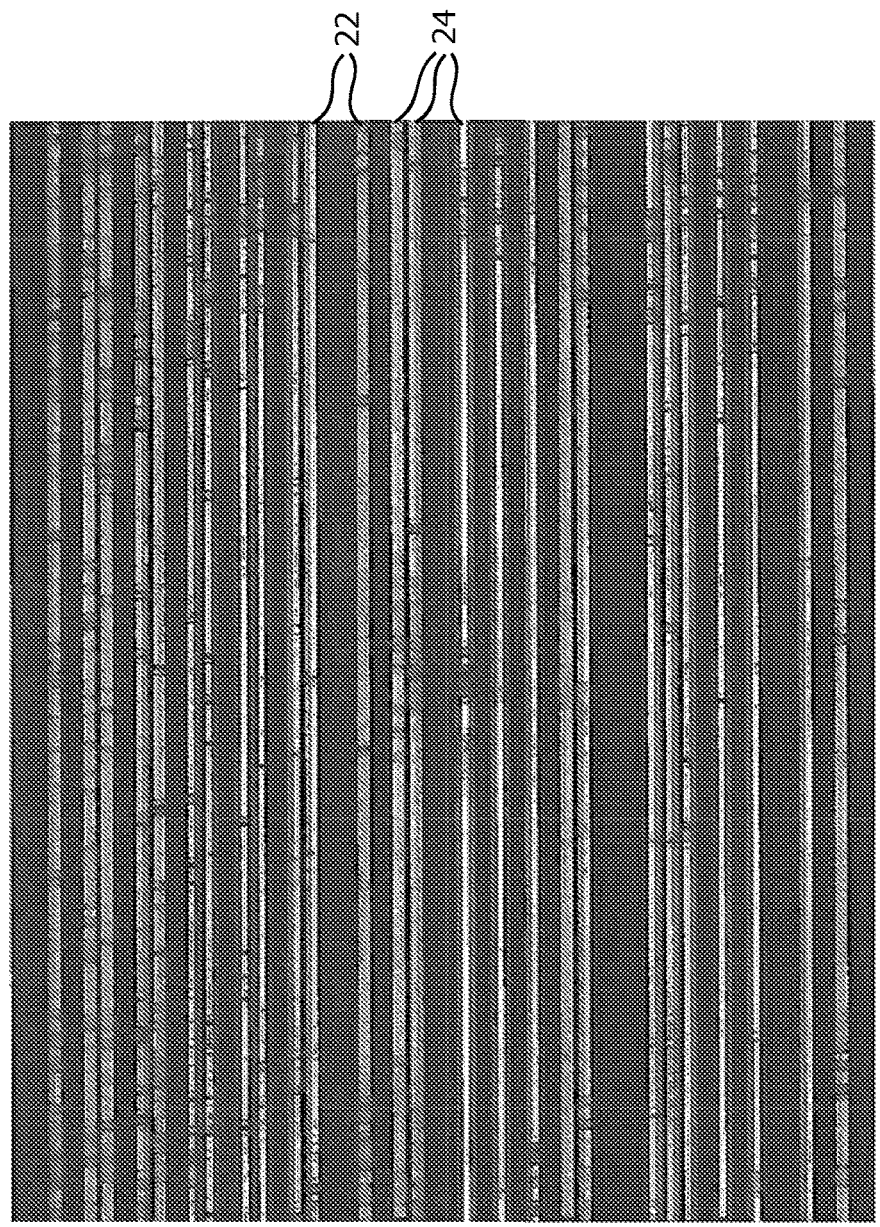
FIG. 2 is an exemplary image of motion detected and partially rejected k-space.

FIG. 2 is an exemplary image of motion detected and partially rejected k-space. The image represents the artifact free partial k-space 12 with reference to FIG. 1. The dark bands 22 represent lines of k-space where motion is detected and then rejected. The lines which are not dark 24 represent lines of k-space where no motion is detected and are used as artifact free k-space data.

Figure 3A:
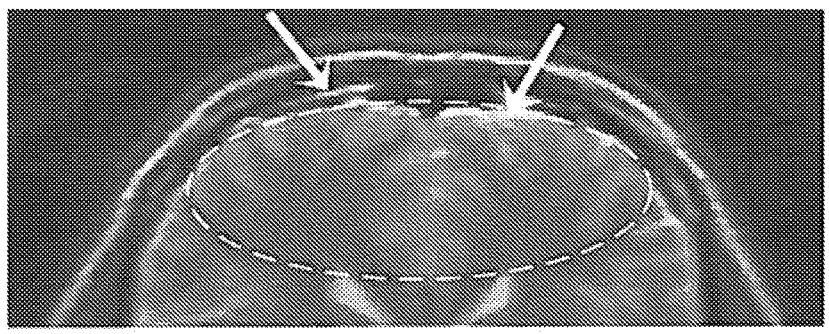
FIG. 3A is an exemplary reconstructed image with high SNR and pulsation artifacts.
Figure 3B:
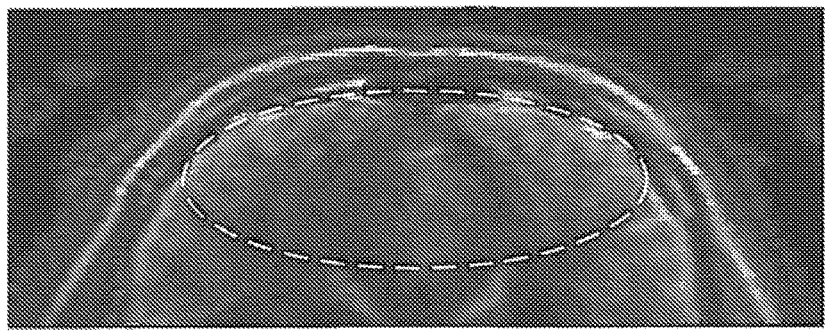
FIG. 3B is an exemplary reconstructed image reconstructed with an embodiment of the local artifact reduction.
Figure 3C:
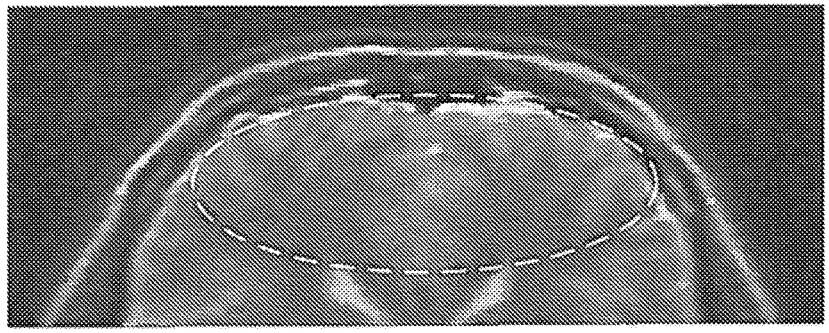
FIG. 3C is an exemplary reconstructed image using COCOA.
Figure 3D:
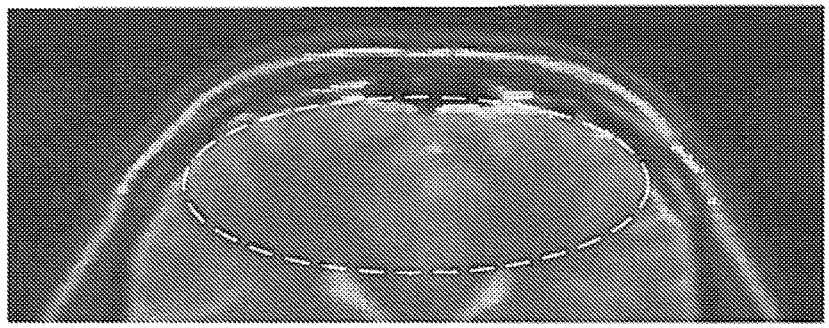
FIG. 3D is an exemplary image using partially parallel image (PPI) reconstruction without prior information.

FIG. 3A is an exemplary reconstructed image with high SNR and pulsation artifacts such as the initial reconstructed image 8 with reference to FIG. 1. Artifacts such as pulsation artifacts appear in the area within the dotted line. The localized artifacts appear as striations. The reduction of the local artifacts can be seen in FIG. 3D which shows the image 16 reconstructed using the image of FIG. 3A and artifact free k-space. The image 16 includes a high SNR and non-rigid motion removed such as the pulsation. The striations or lines dark and light are absent in the image. FIG. 3C provide a comparison with other techniques for image reconstruction such as data convolution and combination operation (COCOA) using the original full k-space. Note that artifacts and/or artifact aliases are present. FIG. 3B provides a reconstruction of an image for comparison which uses only the artifact free k-space data and a partially parallel image reconstruction. The resulting image has a low SNR which results in the absence of image detail.

Figure 4:
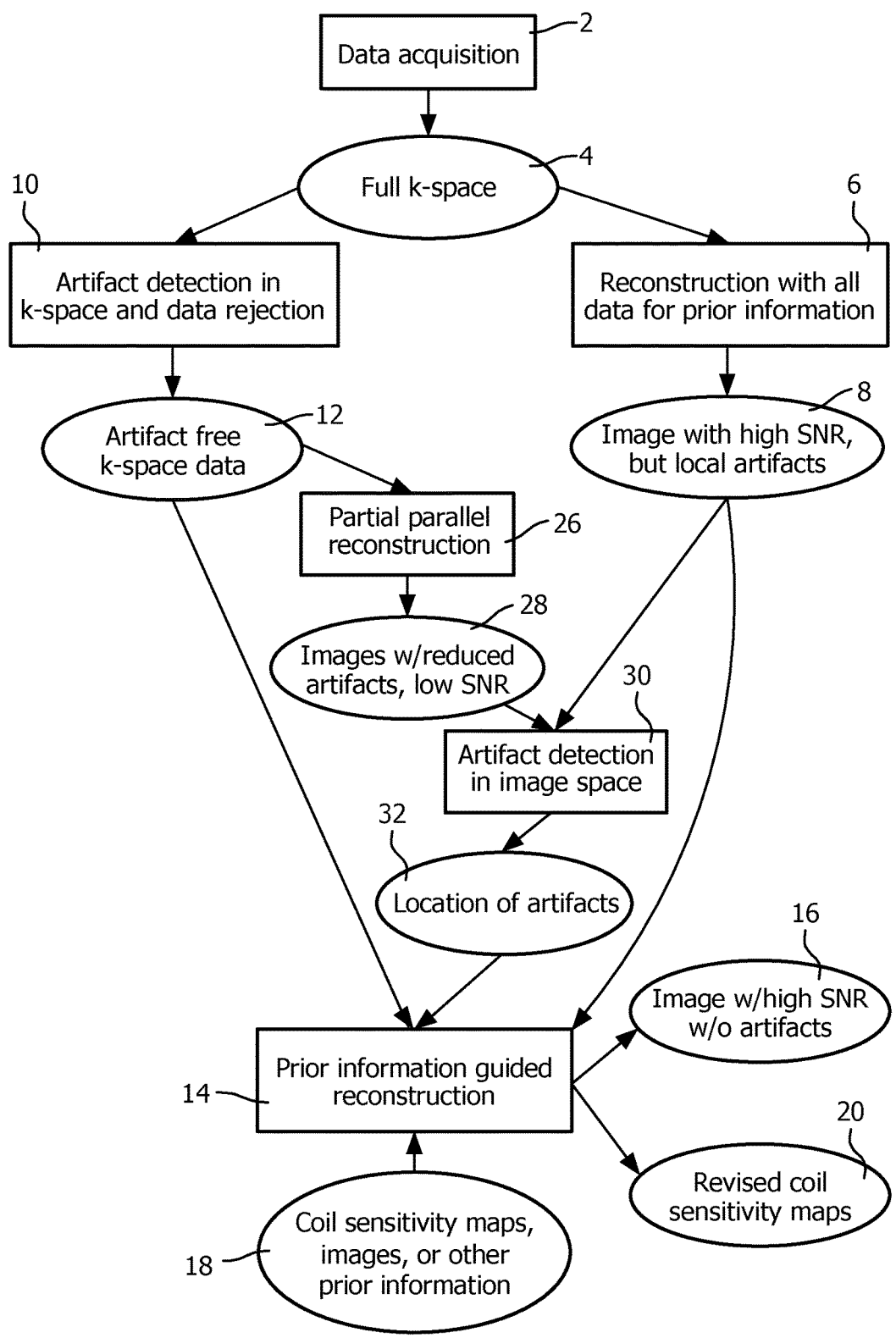
FIG. 4 flowcharts another embodiment of local artifact reduction with insignificant side effects.

FIG. 4 flowcharts another method of local motion artifact reduction with insignificant side effects. MR data is received and stored as a full sample of k-space 4, in a step 2. The MR data in k-space 4 includes non-rigid motion such as eye movement, skin movement, jaw movement, and the like. From the full motion artifacted, k-space 4 a high SNR image 8 is reconstructed in a step 6. The image 8 includes local motion artifacts, but also a high SNR. In a step 10, the full k-space is analyzed for motion. Motion is detected using a technique such as COCOA, GRAPPA, and the like. Portions of k-space where motion is detected are rejected. The remaining or non-rejected portions form artifact free k-space 12. The artifact free k-space data can be stored in a separate memory or referenced directly. The artifact free k-space was shown and described in reference to FIG. 2.

In a step 26, an image 28 is reconstructed from the artifact free partial k-space data 12, or with other techniques for image reconstruction such as data convolution and combination operation (COCOA) using the original full k-space. The image 28 includes reduced or eliminated motion artifacts, but with a low SNR. The reconstruction is performed using partially parallel image (PPI) reconstruction techniques such as shown in reference to FIG. 3B or 3C.

The locations of one or more motion artifacts in the image 28 are identified in a step 30. For example, a difference map 32 is generated between the image 28 reconstructed using PPI and the image 8 reconstructed using the full k-space 4. The difference map indicates with high gradients the locations of artifacts. The difference map is constructed from both images which are from the same original k-space and therefore inherently registered.

In the step 14, prior information guided reconstruction reconstructs an artifact free, high resolution image 16 using prior information which includes the full k-space reconstructed image 8. The prior information can include the difference map or other indication of motion artifact location 32 to provide the location of the artifacts, coil sensitivity maps, and other prior information. For example, the difference map can be used to revise the regularization estimate because the portions of the full k-space reconstructed image 8 which do not include detected motion further minimize the error between the motion free k-space lines and the generated the voxels known to be motion free and include a high SNR. Alternatively, the reconstruction can replace the locations of detected motion in the image with reconstructed portions of motion artifact-free k-space data. The step 14 can include revising the coil sensitivity maps.

Figure 5:
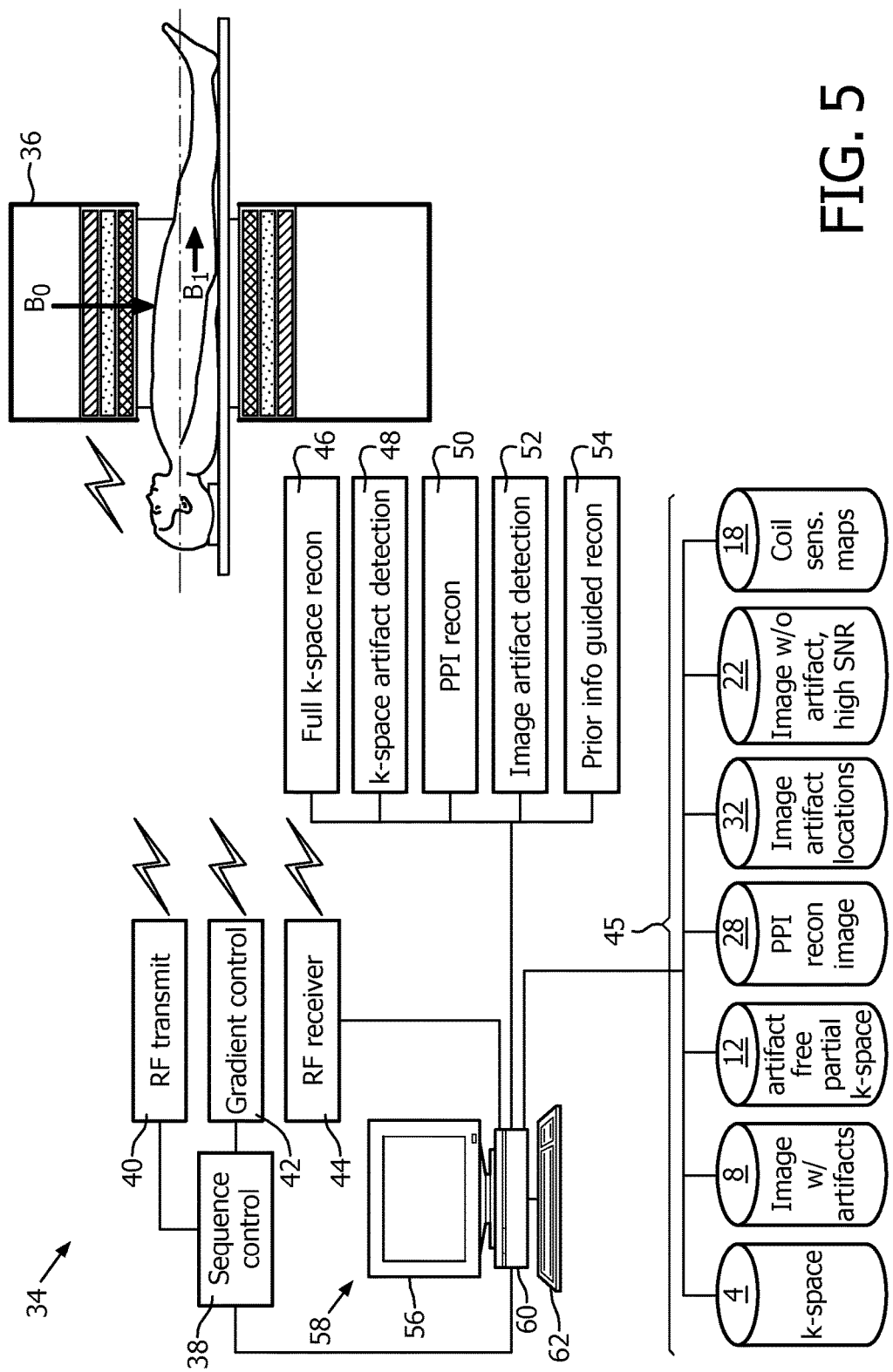
FIG. 5 diagrammatically illustrates an embodiment of a local artifact reduction system.

FIG. 5 diagrammatically illustrates an embodiment of a local artifact reduction system 34. The system 34 includes a magnetic resonance scanner 36 such as a vertical or horizontal bore MR scanner. A sequence controller 38 controls a radio frequency (RF) transmitter 40 and a gradient controller 42. The RF transmitter and the gradient controller excite and manipulate resonance in the subject with RF coils and gradient coils of the MR scanner 36. The MR scanner 36 transmits MR data of the subject to RF receiver(s) 44 which demodulate and store the MR data in a memory 45 as full k-space data 4.

The system 34 includes a full k-space reconstruction module 46 which reconstructs the image 8 from the full k-space data 4. The system 34 includes a k-space artifact detection module 48, a partially parallel image (PPI) reconstruction module 50, an image artifact detection module 52, and a prior information guided reconstruction module 54. The k-space artifact detection module 48 detects motion in the full k-space 4 and rejects portions of k-space which include the detected motion. The k-space artifact detection module can store the non-rejected portions of k-space 12 in a separate memory or memory compartment. The k-space artifact detection module uses techniques such as COCOA to detect motion and reject portions of k-space. The PPI reconstruction module 50 reconstructs the image 28 from the artifact free k-space 12. The image artifact detection module 52 detects locations of motion in the image 8 such as with the difference map 32. The image artifact detection module includes generating the difference map between the full k-space image 8 and the partial k-space image 28 and identifying the portions of high gradient values indicative of motion artifacts. The prior information guided reconstruction module 54 uses parallel imaging techniques such as SENSE with regularization to reconstruct the image 16 which includes reduced motion artifacts and a high SNR from the artifact free partial k-space 12 and the full k-space reconstructed image 8. The full k-space reconstructed image 8 provides the regularization estimate. The prior information guided reconstruction module 54 can include the coil sensitivity maps 18 and the location of artifacts 32 to further refine the regularization estimate. The prior information guided reconstruction module 54 can revise the coil sensitivity maps as an output of the reconstruction process.

The images are displayed on a display device 56 of a workstation 58. The workstation 58 includes an electronic processor or electronic processing device 60, the display 56 which displays the images, menus, panels, and user controls, and the at least one input device 62 which inputs the healthcare practitioner selections. The workstation 58 can be a desktop computer, a laptop, a tablet, a mobile computing device, a smartphone, and the like. The input device can be a keyboard, a mouse, a microphone, and the like.

The various modules 46, 48, 50, 52, 54 are suitably embodied by an electronic data processing device, such as the electronic processor or electronic processing device 60 of the workstation 58, or by a network-based server computer operatively connected with the workstation 58 by a network, or so forth. Moreover, the disclosed reconstruction, k-space motion detection, and image detection techniques are suitably implemented using a non-transitory storage medium storing instructions (e.g., software) readable by an electronic data processing device and executable by the electronic data processing device to perform the disclosed reconstruction and motion detection techniques.

A 'computer-readable storage medium' as used herein encompasses any tangible storage medium which may store instructions which are executable by a processor of a computing device. The computer-readable storage medium may be referred to as a computer-readable non-transitory storage medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. The term computer readable-storage medium also refers to various types of recording media capable of being accessed by the computer device via a network or communication link. For example a data may be retrieved over a modem, over the internet, or over a local area network. References to a computer-readable storage medium should be interpreted as possibly being multiple computer-readable storage mediums. Various executable components of a program or programs may be stored in different locations. The computer-readable storage medium may for instance be multiple computer-readable storage medium within the same computer system. The computer-readable storage medium may also be computer-readable storage medium distributed amongst multiple computer systems or computing devices.

'Computer storage' or 'storage' is an example of a computer-readable storage medium. Computer storage is any non-volatile computer-readable storage medium. The storage may for instance be multiple storage devices within the same computer system or computing device, multiple storages distributed amongst multiple computer systems or computing devices, and/or include cloud based computing storage devices.

'Computer memory' or 'memory' is an example of a computer-readable storage medium. Computer memory is any memory which is directly accessible to a processor.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Cathode ray tube (CRT), Flat panel display, Light-emitting diode (LED) displays, Plasma display panels (PDP), Liquid crystal display (LCD), and the like.

Magnetic Resonance (MR) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

It is to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A medical imaging system, comprising:
a memory which stores magnetic resonance k-space data, the magnetic resonance k-space data including non-rigid motion defects;
one or more processors configured to:
reconstruct a first image from the magnetic resonance k-space data which includes a high signal to noise ratio and motion artifacts;
detect and reject portions of the k-space data which include non-rigid motion defects;
reconstruct a second image from non-rejected portions of the k-space data and the first image using partial parallel reconstruction, the second image including reduced motion artifacts and a lower signal to noise ratio relative to the first image;
identify locations of motion artifacts from the first and second images;
reconstruct an artifact reduced or free image using the first image, the identified locations of the motion artifacts, and the non-rejected k-space data.

2. The system according to claim 1, wherein identifying the location of the motion artifacts includes generating a difference map from the first and second images and reconstructing the artifact reduced or free image includes:
using the difference map and coil sensitivities.

3. A medical imaging system comprising:
a memory which stores magnetic resonance k-space data, the magnetic resonance k-space data including motion defects;
one or more processors configured to:
reconstruct a first image from the magnetic resonance k-space data which includes a high signal to nose ratio and at least one motion artifact;
detect and reject portions of the k-space data which include motion defects;
reconstruct a second image from non-rejected portions of the k-space data and the first image;
reconstruct a third image from the non-rejected portions of k-space and a reference scan;
detect a location of at least one motion artifact in the first, second, or third image;
reconstruct the second image from the non-rejected portions of the k-space data and the first image and the detected location of the at least one motion artifact.

4. The system according to claim 3, wherein the one or more processors are configured to reconstruct the second image using coil sensitivity maps.

5. The system according to claim 4, wherein the one or more processors are further configured to:
revise the coil sensitivity maps based on the location of at least one motion artifact.

6. The system according to claim 3, wherein the one or more processors are further configured to:
generate a difference map between reconstructed portions of the non-rejected portion of the k-space data and the first image which indicate with a high gradient value the at least one artifact.

7. The system according to claim 3, wherein the one or more processors are configured to the detect and reject the portions of the k-space data using a data convolution and combination operation (COCOA).

8. A method of medical imaging, comprising:
receiving magnetic resonance k-space data which includes non-rigid motion defects;
reconstructing a first image from the magnetic resonance k-space data which includes non-rigid motion defects;
detecting and rejecting portions of the magnetic resonance k-space data which include non-rigid motion defects and retaining portions of the magnetic resonance k-space data without the motion defects;
using a SENSE reconstruction technique, reconstructing the retained portions of magnetic resonance k-space data using constraints based on the k-space data which contributes to voxels of the first image without motion artifacts and based on coil sensitivity maps.

9. A non-transitory computer readable storage medium carrying software which controls one or more data processing devices to perform the method according to claim 8.

10. A method of medical imaging comprising:
receiving magnetic resonance k-space data which includes non-rigid motion defects;
reconstructing a first image from the magnetic resonance k-space data which includes non-rigid motion defects;
detecting and rejecting portions of the k-space data which include the non-rigid motion defects;
reconstructing a second image from non-rejected portions of the k-space data and the first image;
reconstructing a third image from the non-rejected portions of the k-space data and a reference scan;
detecting the location of at least one artifact in the first, second, or third image;
reconstructing the second image from the non-rejected portions of the k-space data and the first image and the detected location of at least one artifact.

11. The method according to claim 10, wherein detecting the location of at least one artifact includes:
generating a difference map between reconstructed portions of non-rejected k-space and the first image with high gradient values indicating the at least one artifact.

12. The method according to claim 10, further including:
revising a coil sensitivity map based on the location of at least one artifact.

13. The method according to claim 10, wherein the detecting and rejection of portions of k-space are performed using data convolution and combination operation (CO-COA).

14. A non-transitory computer-readable storage medium carrying software which controls one or more electronic data processing devices to perform the method according to of claim 10.

15. An electronic data processing device configured to perform the method according to claim 10.

* * * * *